United States Patent
Salter et al.

(10) Patent No.: US 11,405,984 B2
(45) Date of Patent: Aug. 2, 2022

(54) MOTOR VEHICLE INCLUDING HEATER FOR EXTERIOR INTERFACE

(71) Applicant: Ford Global Technologies, LLC, Dearborn, MI (US)

(72) Inventors: Stuart C. Salter, White Lake, MI (US); Cornel Lewis Gardner, Romulus, MI (US); Paul Kenneth Dellock, Northville, MI (US); David Brian Glickman, Southfield, MI (US); Tye Arthur Winkel, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 374 days.

(21) Appl. No.: 16/749,079

(22) Filed: Jan. 22, 2020

(65) Prior Publication Data
US 2021/0227641 A1   Jul. 22, 2021

(51) Int. Cl.
*H05B 3/14* (2006.01)
*B62D 25/04* (2006.01)
*G06F 3/0488* (2022.01)
*G06F 3/04886* (2022.01)
*H05B 1/02* (2006.01)
*B60R 25/23* (2013.01)
*B60R 25/24* (2013.01)
*B60R 25/25* (2013.01)

(52) U.S. Cl.
CPC ............ *H05B 3/146* (2013.01); *B62D 25/04* (2013.01); *G06F 3/04886* (2013.01); *H05B 1/0236* (2013.01); *B60R 25/23* (2013.01); *B60R 25/243* (2013.01); *B60R 25/25* (2013.01); *B60R 2325/101* (2013.01); *B60R 2325/103* (2013.01); *B60R 2325/205* (2013.01)

(58) Field of Classification Search
CPC ........ H05B 3/146; H05B 1/0236; H05B 3/84; B62D 25/04; G06F 3/04886; B60R 25/23; B60R 25/243; B60R 25/25; B60R 2325/101; B60R 2325/103; B60R 2325/205; B60R 25/24; B60R 1/0602; H03K 2217/96031; H03K 2217/960755; H03K 17/962; H03K 17/9622; H05K 1/0212
USPC .................... 219/548; 341/33; 345/173, 174; 340/5.72
See application file for complete search history.

(56) References Cited

U.S. PATENT DOCUMENTS 4,628,187 A * 12/1986 Sekiguchi .............. H05B 3/267
                                                                 219/505
5,467,080 A * 11/1995 Stoll .................. G07C 9/00714
                                                                 340/5.72
6,521,868 B1 * 2/2003 Kyrtsos .................... H05B 3/84
                                                                 219/202
(Continued)

FOREIGN PATENT DOCUMENTS

CN         110228426 A       9/2019
GB         2496925 A         5/2013

*Primary Examiner* — Edwin C Holloway, III
(74) *Attorney, Agent, or Firm* — Vichit Chea; Carlson, Gaskey & Olds, P.C.

(57) ABSTRACT

This disclosure relates to a motor vehicle including a heater for an exterior interface. An example assembly includes a human-machine interface adjacent an exterior of the motor vehicle, and a heater configured to selectively thermally condition the human-machine interface. The heater includes a conductive polymer. A method is also disclosed.

20 Claims, 3 Drawing Sheets

(56) References Cited

U.S. PATENT DOCUMENTS

| | | | |
|---|---|---|---|
| 10,296,213 B1* | 5/2019 | Salter | G06F 3/044 |
| 10,351,099 B2 | 7/2019 | Liubakka et al. | |
| 2002/0011477 A1* | 1/2002 | Jones | H05B 3/146 |
| | | | 219/219 |
| 2003/0155467 A1* | 8/2003 | Petrenko | H05B 3/84 |
| | | | 244/134 R |
| 2006/0177212 A1* | 8/2006 | Lamborghini | B60K 37/06 |
| | | | 396/287 |
| 2008/0202912 A1* | 8/2008 | Boddie | H03K 17/962 |
| | | | 200/600 |
| 2009/0040306 A1* | 2/2009 | Foote | B60R 1/04 |
| | | | 348/148 |
| 2010/0038352 A1* | 2/2010 | Byers | B60R 1/088 |
| | | | 219/202 |
| 2010/0296303 A1* | 11/2010 | Sarioglu | H03K 17/9622 |
| | | | 362/487 |
| 2013/0248345 A1* | 9/2013 | Haag | H03K 17/962 |
| | | | 200/600 |
| 2014/0015637 A1* | 1/2014 | Dassanayake | G07C 9/00174 |
| | | | 340/5.54 |
| 2014/0210592 A1* | 7/2014 | Van Wiemeersch | G05B 1/01 |
| | | | 340/5.61 |
| 2017/0050616 A1* | 2/2017 | Liubakka | H01Q 1/2291 |
| 2018/0263082 A1* | 9/2018 | Richmond | H05B 3/84 |
| 2018/0338118 A1* | 11/2018 | Dellock | G02B 27/0006 |
| 2020/0150915 A1* | 5/2020 | Brown | G06F 3/1446 |

* cited by examiner

MOTOR VEHICLE INCLUDING HEATER FOR EXTERIOR INTERFACE

TECHNICAL FIELD

This disclosure relates to a motor vehicle including a heater for an exterior interface.

BACKGROUND

Some known motor vehicles include B-pillar appliques, which are covers attached over the external surfaces of the B-pillars of the motor vehicle. Some known B-pillar appliques include human-machine interfaces, such as keypads with one or more buttons, which may be accessed from the exterior of the motor vehicle and are used to input a code that unlocks the motor vehicle, for example.

SUMMARY

An assembly for a motor vehicle according to an exemplary aspect of the present disclosure includes, among other things, a human-machine interface adjacent an exterior of the motor vehicle, and a heater configured to selectively thermally condition the human-machine interface. The heater includes a conductive polymer.

In a further non-limiting embodiment of the foregoing assembly, the conductive polymer is a polymer material filled with electrically conductive fillers.

In a further non-limiting embodiment of any of the foregoing assemblies, the electrically conductive fillers include one of glass, carbon nanostructures, and graphene.

In a further non-limiting embodiment of any of the foregoing assemblies, the human-machine interface includes at least one button.

In a further non-limiting embodiment of any of the foregoing assemblies, the human-machine interface includes a capacitive touchscreen, and the at least one button includes a plurality of buttons on the capacitive touchscreen.

In a further non-limiting embodiment of any of the foregoing assemblies, the human-machine interface includes a camera.

In a further non-limiting embodiment of any of the foregoing assemblies, the conductive polymer extends along a path substantially circumscribing the buttons and the camera.

In a further non-limiting embodiment of any of the foregoing assemblies, the assembly includes a printed circuit board arranged inward of a cover defining a portion of an exterior surface of the motor vehicle, and the camera is mounted to the printed circuit board.

In a further non-limiting embodiment of any of the foregoing assemblies, the printed circuit board indirectly contacts a body of the motor vehicle via an insulating element.

In a further non-limiting embodiment of any of the foregoing assemblies, the assembly includes a lens covering the camera.

In a further non-limiting embodiment of any of the foregoing assemblies, the lens is molded into the cover.

In a further non-limiting embodiment of any of the foregoing assemblies, the cover is a portion of an applique covering a pillar of the motor vehicle.

In a further non-limiting embodiment of any of the foregoing assemblies, the pillar is the B-pillar of the motor vehicle.

In a further non-limiting embodiment of any of the foregoing assemblies, the assembly includes a first antenna and a second antenna mounted to the printed circuit board. The first antenna is different than the second antenna.

In a further non-limiting embodiment of any of the foregoing assemblies, the assembly includes a controller configured to selectively issue commands activating and deactivating the heater.

In a further non-limiting embodiment of any of the foregoing assemblies, the assembly further includes a sensor configured to generate a signal indicative of a temperature of the human-machine interface. Further, the controller is configured to selectively issue commands to the heater based on the signal.

In a further non-limiting embodiment of any of the foregoing assemblies, the sensor is mounted adjacent a flexible circuit of a capacitive touchscreen.

In a further non-limiting embodiment of any of the foregoing assemblies, the controller is configured to issue a command activating the heater when the signal indicates that ice or snow is present adjacent the human-machine interface, the controller is configured to issue a command deactivating the heater when the signal indicates that the temperature of the human-machine interface meets or exceeds a threshold temperature, and the controller is configured to issue a command deactivating the heater when the heater has been activated for a period of time.

A method according to an exemplary aspect of the present disclosure includes, among other things, heating a human-machine interface adjacent an exterior of a motor vehicle by activating a heater including a conductive polymer.

In a further non-limiting embodiment of the foregoing method, the method includes activating the heater when ice or snow is present adjacent the human-machine interface, deactivating the heater when a temperature of the human-machine interface meets or exceeds a threshold temperature, and deactivating the heater when the heater has been activated for a period of time.

DETAILED DESCRIPTION

This disclosure relates to a motor vehicle including a heater for an exterior interface. An example assembly includes a human-machine interface adjacent an exterior of the motor vehicle, and a heater configured to selectively thermally condition the human-machine interface. The heater includes a conductive polymer. The heater keeps the human-machine interface de-iced and dry. The heater also efficiently spreads heat without requiring large amounts of current, while also being relatively low cost and easy to manufacture and assemble. Further, this disclosure includes a number of thermal management features which dissipate heat and/or prevent heat transfer between certain components. These and other benefits will be appreciated from the below description.

Figure 1:
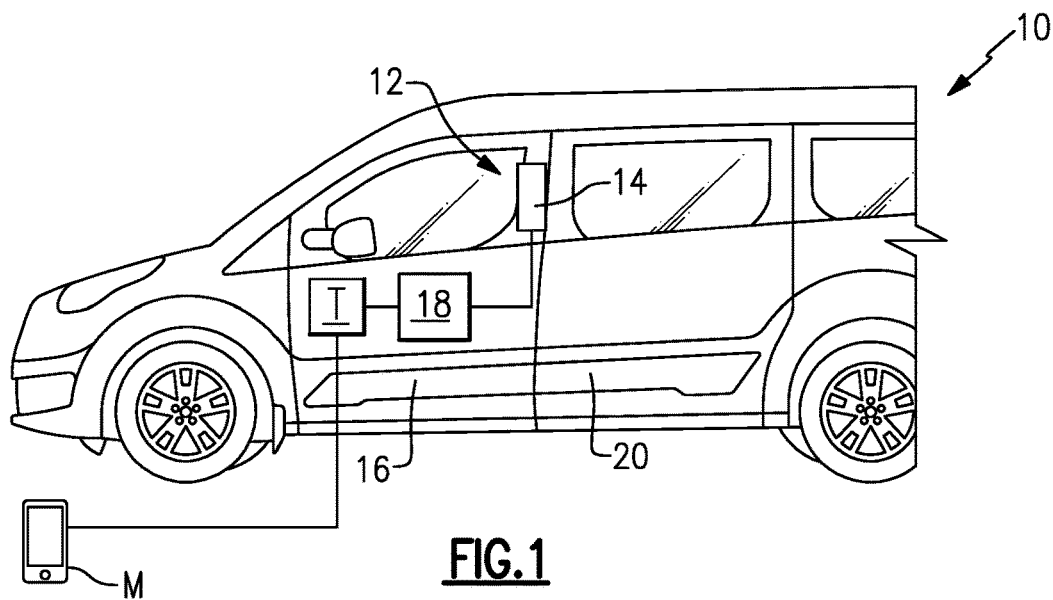
FIG. 1 is a side view of an example vehicle with an exterior interface system on a front door. Some aspects of the exterior interface system are illustrated schematically.

Referring to the drawings, FIG. 1 is a view of a motor vehicle 10 ("vehicle 10"). In one example, the vehicle 10 is a fully autonomous vehicle configured to sense its surroundings and control and guide itself between destinations without a human operator. In the example, the vehicle 10 includes a self-driving system (SDS), and is classified as a "Level 5" autonomous vehicle under the ranking system published by the Society of Automotive Engineers (SAE). This disclosure applies to lower level autonomous vehicles, and also applies to vehicles that are not autonomous vehicles. Further, while the vehicle 10 is shown as a passenger van, this disclosure is not limited to any particular vehicle type, and extends to cars, trucks, and sport utility vehicles (SUVs), as examples.

The vehicle 10 includes an exterior interface system 12 including at least one human-machine interface such as a touchscreen or a physical keypad including a plurality of physical buttons. In FIG. 1, the vehicle 10 includes a human-machine interface 14 on a front door 16, which is a driver-side door of the vehicle 10. In particular, the human-machine interface 14 is mounted to an external surface on and/or adjacent a rear edge of the front door 16, for example on and/or adjacent the B-pillar applique. In particular, the human-machine interface 14 may be a part of the B-pillar applique.

The human-machine interface 14 is electrically coupled to a controller 18 and is responsive to commands from the controller 18. Further, in FIG. 1, the human-machine interface 14 includes a capacitive touchscreen, and permits users to input information, which may then be interpreted by the controller 18, saved, and/or transmitted to a central server via a transceiver T, for example. In this disclosure, the term user is used to refer to prospective passengers (i.e., before they have boarded the vehicle), current passengers, and former passengers (i.e., passengers that have exited the vehicle).

While in FIG. 1 there is one human-machine interface on the driver side of the vehicle 10, it should be understood that the opposite, passenger side of the vehicle 10 may also include a similar human-machine interface on a rear edge of the front passenger-side door. Further, while the human-machine interface 14 is on the front door 16, the vehicle 10 could include the human-machine interface on a rear door 20 of the vehicle 10, such as a rear sliding door. Further, the vehicle 10 could include two or more human-machine interfaces on the same side of the vehicle.

The controller 18 is configured to receive information from the exterior interface system 12 and is configured to interpret that information and issue commands to various components of the vehicle 10 based on that information. The controller 18 is shown schematically in FIG. 1. It should be understood that the controller 18 may include hardware and software, and could be part of an overall vehicle control module, such as a vehicle system controller (VSC), or could alternatively be a stand-alone controller separate from the VSC. Further, the controller 18 may be programmed with executable instructions for interfacing with and operating the various components of the vehicle 10. The controller 18 additionally includes a processing unit and non-transitory memory for executing the various control strategies and modes of the vehicle system.

Figure 2:
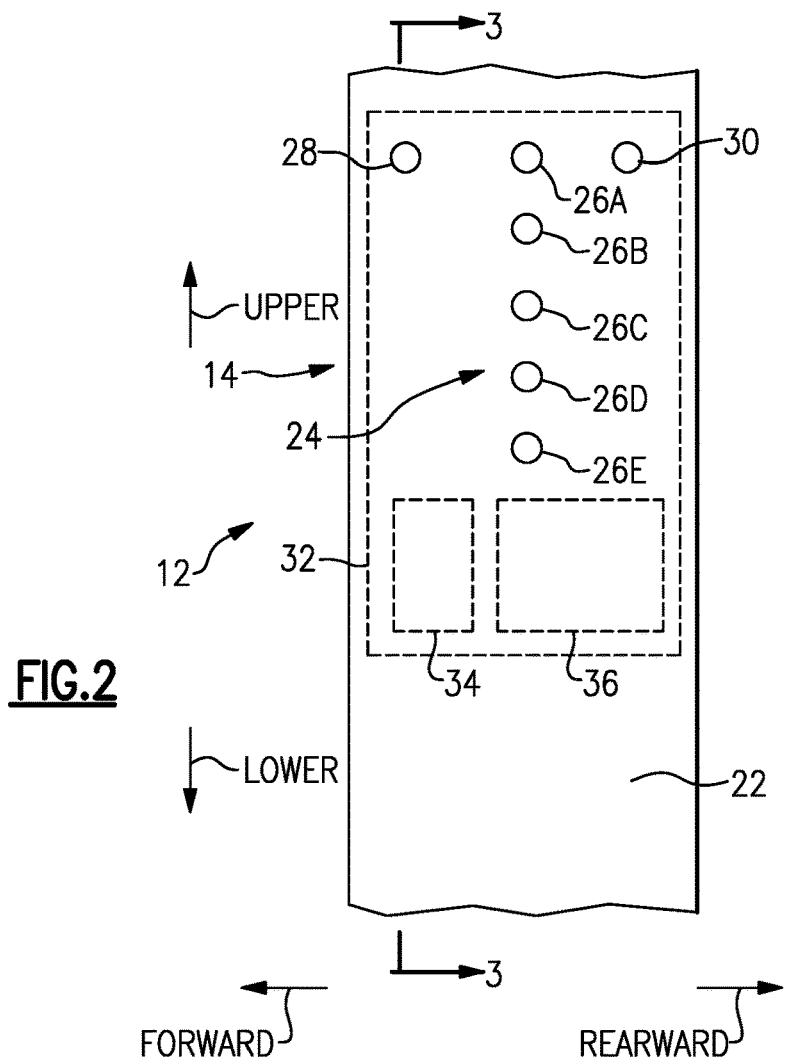
FIG. 2 illustrates the exterior interface system in more detail.

FIG. 2 illustrates the exterior interface system 12 in more detail. FIG. 2 illustrates the exterior interface system 12 from an exterior perspective relative to a cover 22 covering the B-pillar of the vehicle 10. As such, the cover 22 is a B-pillar applique. Only a portion of a B-pillar applique is shown in FIG. 2. The cover 22 may be attached to other covers such that the covers together provide an entire B-pillar applique. Alternatively, the cover 22 may provide an entire B-pillar applique.

The human-machine interface 14 in this example includes a capacitive touchscreen 24 with five buttons 26A-26E. The five buttons 26A-26E include the numbers 0 through 9, with two numbers on each button. The buttons 26A-26E are aligned vertically (the "upper and lower" directions are labeled in various figures, as are the "forward" and "rearward" directions, for ease of reference) in a column, with one over the other (i.e., button 26B is directly beneath 26A, and so on). The buttons 26A-26E may be used by a user to enter a pin code. Upon receipt of the proper pin code, the controller 18 may instruct the vehicle 10 to unlock or take some other action. The pin code may be used in ridesharing or on demand applications to verify an identity of a user. While five buttons 26A-26E are shown, this disclosure extends to human-machine interfaces with a different number of buttons. Further, this disclosure extends to human-machine interfaces with physical buttons in addition to or as an alternative to buttons on a touchscreen.

The human-machine interface 14 also includes two cameras 28, 30 on opposite sides of the column of buttons 26A-26E. The cameras 28, 30 electrically coupled to the controller 18 and are configured to capture still images or video. The images and/or video captured by the cameras 28, 30 may be recorded on the controller 18, for example, or stored on a remote server (i.e., the cloud). The cameras 28, 30 may be used to perform facial recognition. The controller 18, for example, is able to verify an identify of a user via the images/video received from the cameras 28, 30 and to command the vehicle to unlock or take other action. Facial recognition may be used in ridesharing or on demand applications to verify user identity. Having two cameras increases the ability to perform facial recognition. However, while two cameras 28, 30 are shown in FIG. 2, this disclosure extends to human-machine interfaces with one or more cameras.

Figure 3:
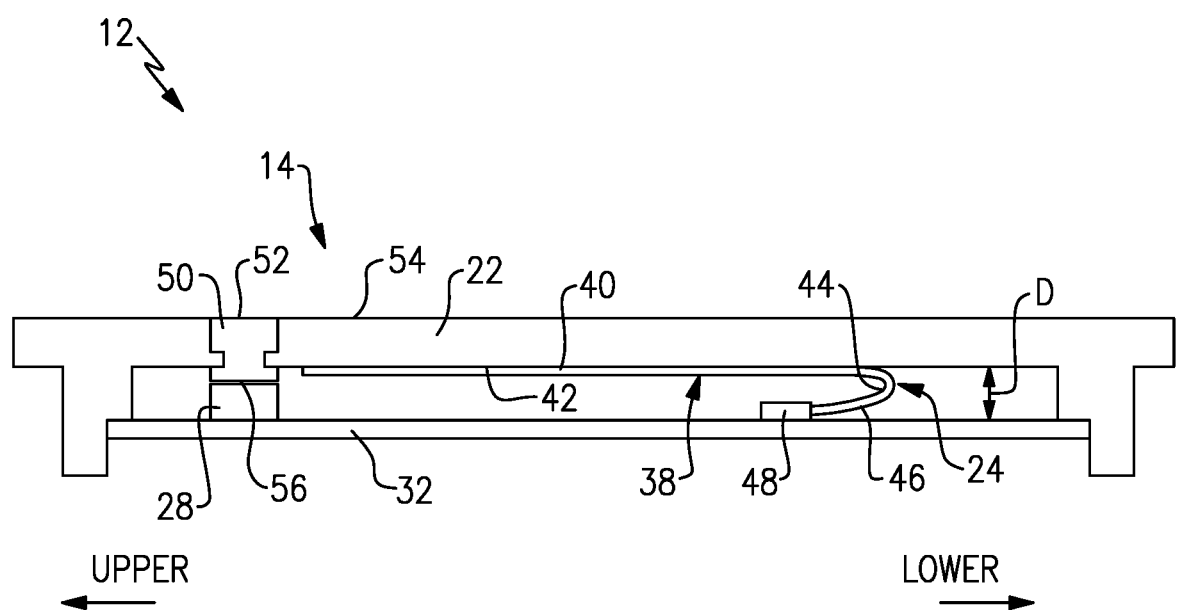
FIG. 3 is a cross-sectional view of the exterior interface system taken along line 3-3 from FIG. 2.

The capacitive touchscreen 24 and the cameras 28, 30 are mounted to a common printed circuit board (PCB) 32 in this example. The printed circuit board 32 includes a substrate and a plurality of tracings. With reference to FIG. 3, the printed circuit board 32 is spaced inward (i.e., toward the centerline of the vehicle 10) from the cover 22 by a distance D. The printed circuit board 32 is capable of performing one or more of the functions of the controller 18. Alternatively or additionally, the printed circuit board 32 is electrically coupled to the controller 18. In a particular example, the controller 18 may be at least partially on the printed circuit board 32.

With reference to FIG. 2, first and second antennas 34, 36 are also mounted to the printed circuit board 32. In this example, the first and second antennas 34, 36 are different types of antennas. The first antenna 34 is a Bluetooth Low Energy (BLE) antenna and the second antenna 36 is a near field communication (NFC) antenna. The first and/or second antenna 34, 36 may be configured such that a mobile device M (FIG. 1) of the user may be used as a key to start, stop, lock, and/or unlock the vehicle 10, otherwise known as phone as a key (PAAK) functionality. The first and second antennas 34, 36 may be formed of copper and integrated into the layers of the printed circuit board 32. Incorporating cameras, a touchscreen, and multiple antennas onto a single printed circuit board reduces manufacturing cost and assembly time, and otherwise provides a compact design.

FIG. 3 illustrates additional detail of the capacitive touchscreen 24 and the cameras 28, 30. The capacitive touchscreen 24, in this example, includes a flexible circuit 38 having a first section 40 which provides the buttons 26A-26E. The first section 40 abuts an inner surface 42 of the cover 22 and may be attached to the inner surface 42 by adhesive. To this end, the cover 22 may be made at least partially of a polymer material configured to transmit the force of a user's hand or finger to the first section 40, which may include a plurality of capacitive sensors corresponding to the buttons 26A-26E. The flexible circuit 38 further includes a bend 44 and a second section 46 leading from the bend 44 to a connector 48. The connector 48 electrically couples the flexible circuit 38 to the printed circuit board 32. The connector 48 may be any known type of electrical connector, such as a zero insert force (ZIF) connector. The arrangement of the flexible circuit 38 is such that the buttons 26A-26E are spaced-apart from the printed circuit board 32 by about the distance D, which reduces heat transfer between the buttons 26A-26E and the printed circuit board 32.

Further, as shown in FIG. 3, the camera 28 is directly mounted to the printed circuit board 32. The camera 30 is not visible in FIG. 3, but it is arranged similarly to the camera 28. A lens 50 is insert molded, in this example, into the cover 22. The lens 50 may be formed of a polymer material or a glass material. The lens 50 includes an outer surface 52 substantially flush with an outer surface 54 of the cover 22. The lens 50 further includes an inner surface 56 contacting the camera 28. The lens 50 is thicker than the cover 22 in this example, such that the inner surface 56 is inward of the inner surface 42 of the cover 22.

Figure 4:
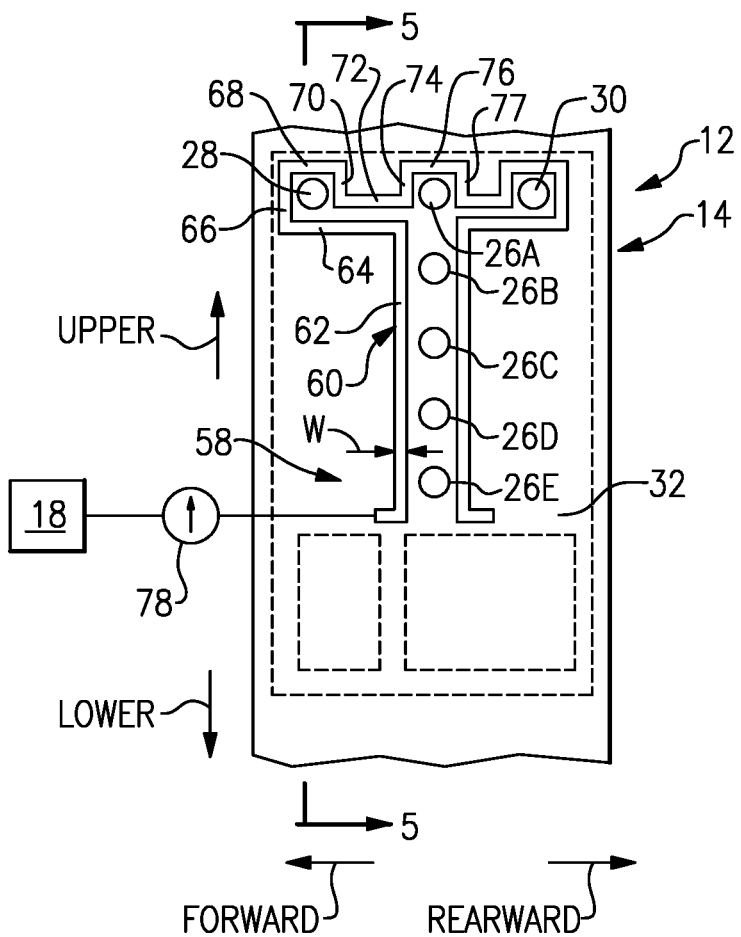
FIG. 4 illustrates an additional aspect of the exterior interface system, namely a heater.

A particular aspect of this disclosure relates to thermally conditioning the exterior interface system 12, and namely the human-machine interface 14. In this aspect of the disclosure, the exterior interface system 12 includes a heater 58, as shown in FIG. 4. The term heater as used in this disclosure refers to one or more devices which work to heat the human-machine interface 14.

With reference to FIG. 4, the heater 58 includes a conductive polymer 60 arranged adjacent the buttons 26A-26E and the cameras 28, 30. The conductive polymer 60 is an electrically conductive material. The conductive polymer 60 may be a polymer material filled with one or more types of conductive fillers, such as glass, carbon nanostructures, or graphene. Specifically, example fillers are ATHLOS™ Carbon Nanostructures, made commercially available by Cabot Corporation, and GrapheneBlack™, made commercially available by NanoXplore. In one example, the conductive polymer 60 includes an electrical resistivity of about 4 ohm-cm.

The conductive polymer 60 is substantially narrow in width W and has a thickness Z (FIG. 5) less than that of the cover 22. The length of the conductive polymer 60 is routed around and adjacent the buttons 26A-26E and cameras 28, 30 to thermally condition those components, and specifically to prevent the formation of snow and ice and/or melt existing snow and ice. The conductive polymer 60, in one example, is adhered to the inner surface 42 of the cover 22. In another example, the conductive polymer 60 is overmolded or insert molded with the cover 22.

In general, the length of the conductive polymer 60 extends along a path which substantially circumscribes the buttons 26A-26E and the camera 28, 30. In the example of FIG. 4, the length of the conductive polymer 60 includes a first leg 62 extending vertically from adjacent the bottom-most button 26E to the top-most button 26A. The first leg 62 leads to a second leg 64 normal to the first leg 62, and which leads to a series of legs, namely third leg 66, fourth leg 68, and fifth leg 70, which are normal to one another and circumscribe the camera 28. The fifth leg 70 leads to a sixth leg 72, which extends horizontally between the camera 28 and the top-most button 26A. From there, the sixth leg 72 leads to a plurality of legs, namely seventh leg 74, eighth leg 76, and ninth leg 77, which are normal to one another and circumscribe the top portion of the top-most button 26A. The remainder of length of the conductive polymer 60 is substantially symmetrical, about a vertically-extending line, as to what has been described in the preceding sentences. While a particular arrangement of the conductive polymer 60 has been described, it should be understood that other conductive polymer arrangements come within the scope of this disclosure.

Figure 5:
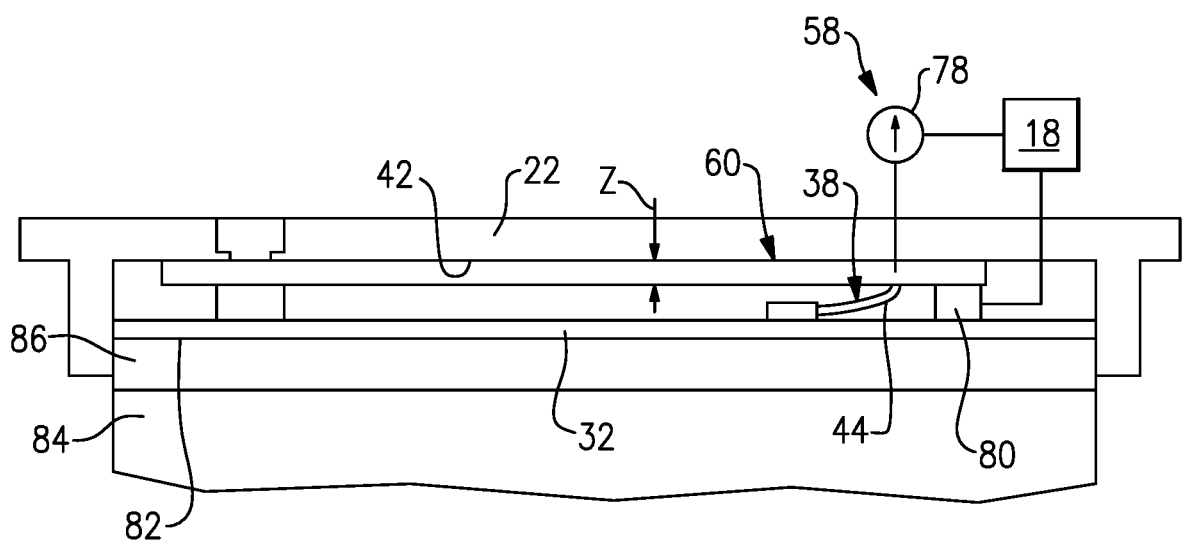
FIG. 5 is a cross-sectional view of the exterior interface system, including the heater, taken along line 5-5 from FIG. 4.

In addition to the conductive polymer 60, the heater 58 includes the controller 18 and a current source 78, as shown in FIGS. 4 and 5. The current source 78 may be part of the controller 18 and, in turn, may be part of the printed circuit board 32. The controller 18 is configured to selectively issue commands activating (i.e., turning on) and deactivating (i.e., turning off) the heater 58 by selectively directing current through the conductive polymer 60.

The controller 18 is electrically coupled to a sensor 80 (FIG. 5) configured to configured to generate a signal indicative of a temperature of the human-machine interface 14. The sensor 80 may be a thermistor in one example. In the example of FIG. 5, the sensor 80 is mounted to the printed circuit board 32 near the bend 44 in the flexible circuit 38.

The controller 18 selectively issues commands to the heater 58 based on the signal from the sensor 80. In a particular example, the controller 18 issues a command activating the heater 58 (i.e., commanding the current source 78 to direct current through the conductive polymer 60) when the signal from the sensor 80 indicates that ice or snow is present adjacent the human-machine interface 14. The controller 18 may also issue a command deactivating the heater 58 (i.e., stopping the flow of current through the conductive polymer 60) when the signal indicates that the temperature of the human-machine interface 15 meets or exceeds a threshold temperature, such as 100° F. Further, the controller 18 may issue a command deactivating the heater 58 when the heater 58 has been activated for a period of time, such as 15 minutes. And further, when the vehicle 10 is a battery electric vehicles (BEVs), the controller 18 may issue a command deactivating the heater 58 when a state of charge of a battery pack of the vehicle 10 is below a threshold state of charge, such as 70%. This aspect of the control strategy prevents the heater 58 from draining the battery pack.

Another aspect of this disclosure relates to dissipating heat from the printed circuit board 32 using the body structure of the vehicle 10. With reference to FIG. 5, an inner surface 82 of the printed circuit board 32 indirectly contacts a body structure 84 of the vehicle 10 providing the B-pillar. The body structure 84 acts as a heat sink for the printed circuit board 32. In one example the body structure 84 is made of metal. Thus, an electrically insulating element 86 is provided between the inner surface 82 and the body structure 84. The insulating element 86 may be a thermally conductive polymer or a silicone material, as examples.

It should be understood that terms such as "about," "substantially," and "generally" are not intended to be boundaryless terms, and should be interpreted consistent with the way one skilled in the art would interpret those terms. It should also be understood that terms such as "forward," "rearward," "side," "upper," "lower," etc., are used herein relative to the normal operational attitude of the vehicle 10 for purposes of explanation only, and should not be deemed limiting.

Although the different examples have the specific components shown in the illustrations, embodiments of this disclosure are not limited to those particular combinations. It is possible to use some of the components or features from one of the examples in combination with features or components from another one of the examples. In addition, the various figures accompanying this disclosure are not necessarily to scale, and some features may be exaggerated or minimized to show certain details of a particular component or arrangement.

One of ordinary skill in this art would understand that the above-described embodiments are exemplary and non-limiting. That is, modifications of this disclosure would come within the scope of the claims. Accordingly, the following claims should be studied to determine their true scope and content.

The invention claimed is:

1. An assembly for a motor vehicle, comprising:
    a human-machine interface adjacent an exterior of the motor vehicle, wherein the human-machine interface includes a capacitive touchscreen and a plurality of buttons on the capacitive touchscreen; and
    a heater configured to selectively thermally condition the human-machine interface, the heater including a conductive polymer, wherein the conductive polymer extends along a path substantially circumscribing the buttons.

2. The assembly as recited in claim 1, wherein the conductive polymer is a polymer material filled with electrically conductive fillers.

3. The assembly as recited in claim 2, wherein the electrically conductive fillers include one of glass, carbon nanostructures, and graphene.

4. The assembly as recited in claim 1, wherein the human-machine interface includes a camera and the path substantially circumscribes the camera.

5. The assembly as recited in claim 4, further comprising:
    a printed circuit board arranged inward of a cover defining a portion of an exterior surface of the motor vehicle; and
    wherein the camera is mounted to the printed circuit board.

6. The assembly as recited in claim 5, wherein the printed circuit board indirectly contacts a body of the motor vehicle via an insulating element.

7. The assembly as recited in claim 5, further comprising a lens covering the camera.

8. The assembly as recited in claim 7, wherein the lens is molded into the cover.

9. The assembly as recited in claim 5, wherein the cover is a portion of an applique covering a pillar of the motor vehicle.

10. The assembly as recited in claim 9, wherein the pillar is the B-pillar of the motor vehicle.

11. The assembly as recited in claim 5, further comprising:
    a first antenna and a second antenna mounted to the printed circuit board, wherein the first antenna is different than the second antenna.

12. The assembly as recited in claim 1, further comprising:
    a controller configured to selectively issue commands activating and deactivating the heater;
    a sensor configured to generate a signal indicative of a temperature of the human-machine interface; and
    wherein the controller is configured to selectively issue commands to the heater based on the signal.

13. The assembly as recited in claim 12, wherein the sensor is mounted adjacent a flexible circuit of a capacitive touchscreen.

14. The assembly as recited in claim 12, wherein:
    the controller is configured to issue a command activating the heater when the signal indicates that ice or snow is present adjacent the human-machine interface,
    the controller is configured to issue a command deactivating the heater when the signal indicates that the temperature of the human-machine interface meets or exceeds a threshold temperature, and
    the controller is configured to issue a command deactivating the heater when the heater has been activated for a period of time.

15. A method, comprising:
    heating a human-machine interface adjacent an exterior of a motor vehicle by activating a heater including a conductive polymer, wherein the human-machine interface includes a plurality of buttons, and wherein the conductive polymer extends along a path substantially circumscribing the plurality of buttons.

16. The method as recited in claim 15, further comprising the steps of:
    activating the heater when ice or snow is present adjacent the human-machine interface;
    deactivating the heater when a temperature of the human-machine interface meets or exceeds a threshold temperature; and
    deactivating the heater when the heater has been activated for a period of time.

17. The assembly as recited in claim 1, wherein the path includes a plurality of legs, wherein each of the legs extends normal to adjacent ones of the legs.

18. The assembly as recited in claim 17, wherein the path and orientation of the plurality of legs is symmetrical about a vertical line.

19. The assembly as recited in claim 1, wherein the path includes a plurality of connected sections, and each of the sections extends along a respective straight line.

20. The assembly as recited in claim 1, wherein the path substantially surrounds the buttons when the assembly is viewed from an exterior perspective.

* * * * *